US010159164B2

(12) United States Patent
Liao et al.

(10) Patent No.: US 10,159,164 B2
(45) Date of Patent: Dec. 18, 2018

(54) SUSPENSION TYPE SLIDING BRACKET HAVING ANTI-DROPPING MECHANISM

(71) Applicant: CYBER POWER SYSTEMS, INC., Taipei (TW)

(72) Inventors: Chun-Chao Liao, Taipei (TW); Wen-Ju Hsieh, Taipei (TW); Jing-Jhong Wu, Taipei (TW)

(73) Assignee: CYBER POWER SYSTEMS, INC., Taipei (TW)

(*) Notice: Subject to any disclaimer, the term of this patent is extended or adjusted under 35 U.S.C. 154(b) by 13 days.

(21) Appl. No.: 15/364,974

(22) Filed: Nov. 30, 2016

(65) Prior Publication Data
US 2017/0164507 A1 Jun. 8, 2017

(30) Foreign Application Priority Data
Dec. 3, 2015 (TW) .............................. 104140464 A

(51) Int. Cl.
*H05K 7/18* (2006.01)
*A47B 88/00* (2017.01)
*H05K 7/16* (2006.01)
*A47B 88/04* (2006.01)
*A47B 88/12* (2006.01)
*H05K 7/14* (2006.01)

(52) U.S. Cl.
CPC ........... H05K 7/183 (2013.01); A47B 88/044 (2013.01); A47B 88/12 (2013.01); H05K 7/1489 (2013.01)

(58) Field of Classification Search
CPC .... H05K 7/183; H05K 7/1489; A47B 88/044; A47B 88/12

USPC ........... 248/27.1, 27.3, 298.1, 200.1, 222.11, 248/225.11; 211/26, 183; 312/334.44, 312/333, 334.46; 361/679.02, 679.58, 361/727
See application file for complete search history.

(56) References Cited

U.S. PATENT DOCUMENTS

| 6,318,679 B1* | 11/2001 | Yang ...................... G06F 1/184 248/201 |
| 6,601,713 B2 | 8/2003 | Kaminski |
| 6,601,933 B1* | 8/2003 | Greenwald .......... H05K 7/1489 312/330.1 |
| 8,358,502 B2 | 1/2013 | Keitel et al. |
| 8,605,442 B2* | 12/2013 | Wu ...................... H05K 7/1489 211/26 |

(Continued)

FOREIGN PATENT DOCUMENTS

| CN | 1424725 A | 6/2003 |
| TW | I237752 B | 8/2005 |

*Primary Examiner* — Tan Le
(74) *Attorney, Agent, or Firm* — Bacon & Thomas, PLLC

(57) ABSTRACT

A suspension type sliding bracket having anti-dropping mechanism, the sliding bracket uses a first sliding rail of suspension type to slide on a first bracket, and the sliding bracket uses a second sliding rail of suspension type to slide on a second bracket, a front-end portion of the first sliding rail can provided with a first locating plate, a front-end portion of the first bracket can provided with a first locating post; wherein the first locating post can enter a first slot of the first locating plate, and the first locating post can block a closure portion of the first slot, therefore the first sliding rail can form a first anti-dropping position to stop slide; and the first slot can escape from the first locating post when an extension portion of the first locating plate is pressed.

8 Claims, 21 Drawing Sheets

(56) References Cited

U.S. PATENT DOCUMENTS 9,545,153 B2 * 1/2017 Chen .................... H05K 7/1489

* cited by examiner

SUSPENSION TYPE SLIDING BRACKET HAVING ANTI-DROPPING MECHANISM

BACKGROUND OF THE INVENTION

1. Field of the Invention

The invention relates to a sliding bracket, and more particularly to a suspension type sliding bracket having anti-dropping mechanism, the sliding bracket has at least one first locating plate, the first locating plate can be used to form a first anti-dropping position on the sliding bracket, and the first anti-dropping position can be released by pressing the first locating plate.

2. Description of Related Art

A first prior-art is disclosed in U.S. Pat. No. 6,601,713 (its patent family has Taiwan Patent No. TW1237752 and China Patent No. CN1424725A), the first prior-art disclosed a latched position protrusion engages a side of opening so as to prevent further outward movement of intermediate slide relative to outer slide, a stop tab limits inward movement of intermediate slide relative to outer slide. But the latched position protrusion can not be dismantled, the intermediate slide can not escape from the outer slide when a pair of slide assemblies combined with a chassis. Moreover, the chassis can not completely escape from a rack, that will not easy to replace or repair a device which is fixed on the chassis. Thus, there is a requirement of improvement for the first prior-art.

A second prior-art is disclosed in U.S. Pat. No. 8,358,502, the second prior-art disclosed two rail parts may be coupled together via two lips, the rail parts may be secured by bolting in two holes, which may be secured with two wing-nuts. In the second prior-art, the rail parts can not be separated each other until the wing-nuts are dismantled. If the rail parts are not separated each other, an electronic device can not completely escape from a server rack. Thus, there is a requirement of improvement for the second prior-art.

SUMMARY OF THE INVENTION

It is therefore an object of the invention to provide a suspension type sliding bracket having anti-dropping mechanism, the invention uses a first sliding rail of suspension type to slide on a first bracket, and the invention uses a second sliding rail of suspension type to slide on a second bracket; a device can be fixed between the first sliding rail and the second sliding rail, the first and second brackets can be fixed on a first level space of a rack; wherein a front-end portion of the first sliding rail can provided with a first locating plate, a front-end portion of the first bracket can provided with a first locating post; when the device is pulled out, the first locating post will enter a first slot of the first locating plate, and the first locating post will block a closure portion of the first slot, therefore the first sliding rail can form a first anti-dropping position to stop slide; and the first slot can escape from the first locating post when an extension portion of the first locating plate is pressed, therefore the device can be completely pulled out.

First advantages of the invention is, the suspension type sliding bracket can form a first anti-dropping position, and a device can be completely pulled out when an extension portion of the first locating plate is pressed.

Second advantages of the invention is, the suspension type sliding bracket can form a first anti-dropping position and a second anti-dropping position; when the device is pulled out, the device will stop on the first anti-dropping position; the device can be further pulled out when an extension portion of the first locating plate is pressed, the device will stop on the second anti-dropping position; and the device can be completely pulled out when an extension portion of the second locating plate is pressed.

Third advantages of the invention is, the suspension type sliding bracket can reduce the height of each level space; when another device is disposed on the rack, another first bracket will not interfere to the first sliding rail, and another second bracket will not interfere to the second sliding rail.

Fourth advantages of the invention is, a first support screw can be screw fixed on the suspension type sliding bracket, a screw head of the first support screw can pass through a fixing hole of the rack, the fixing hole can support a neck of the first support screw, therefore a single operator can proceed to fix the sliding bracket to easy assemble.

The above and other objects, features and advantages of the invention will become apparent from the following detailed description taken with the accompanying drawings.

DETAILED DESCRIPTION OF THE INVENTION

Figure 1:
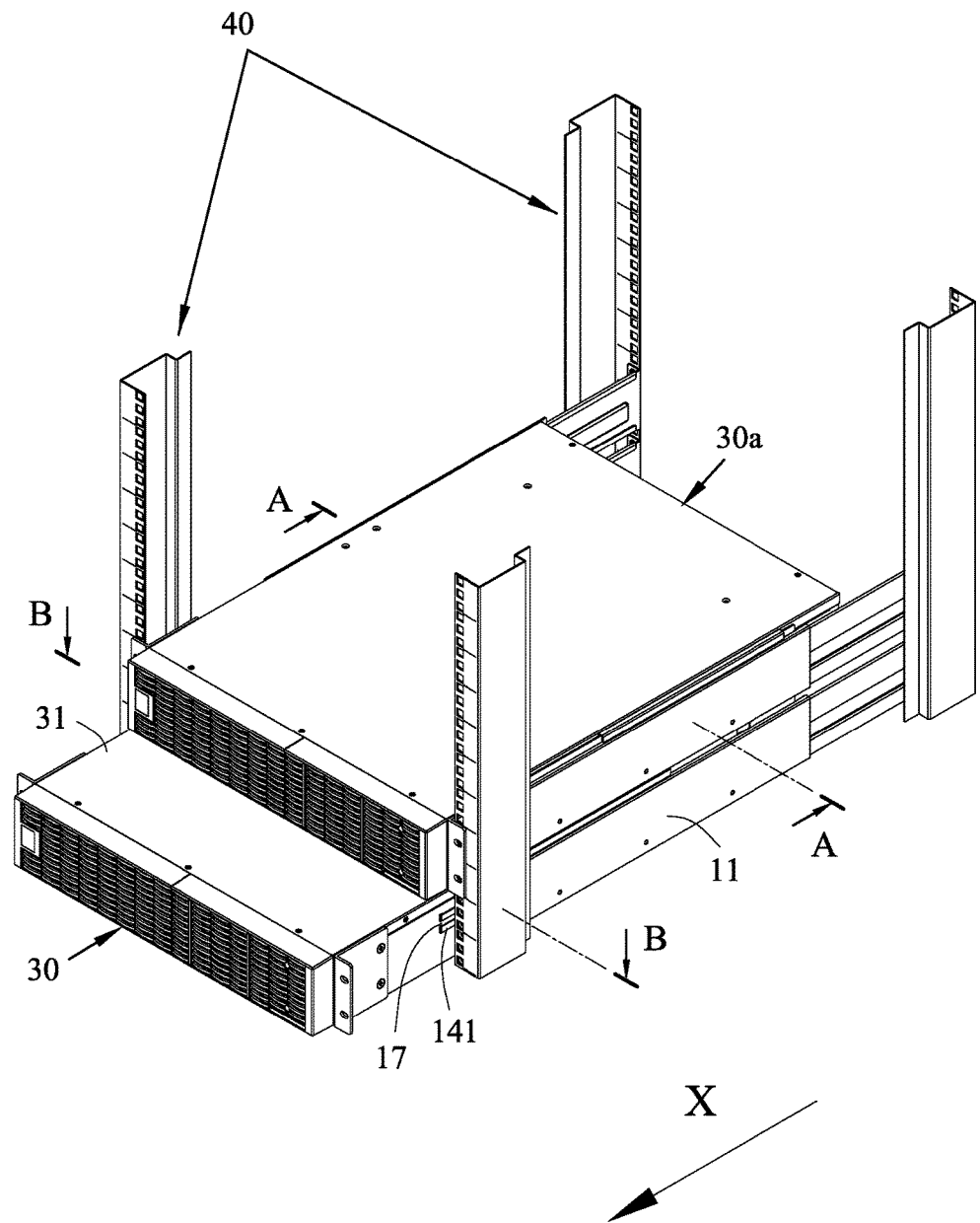
FIG. 1 is a perspective view showing a first preferred embodiment of the invention.
Figure 2:
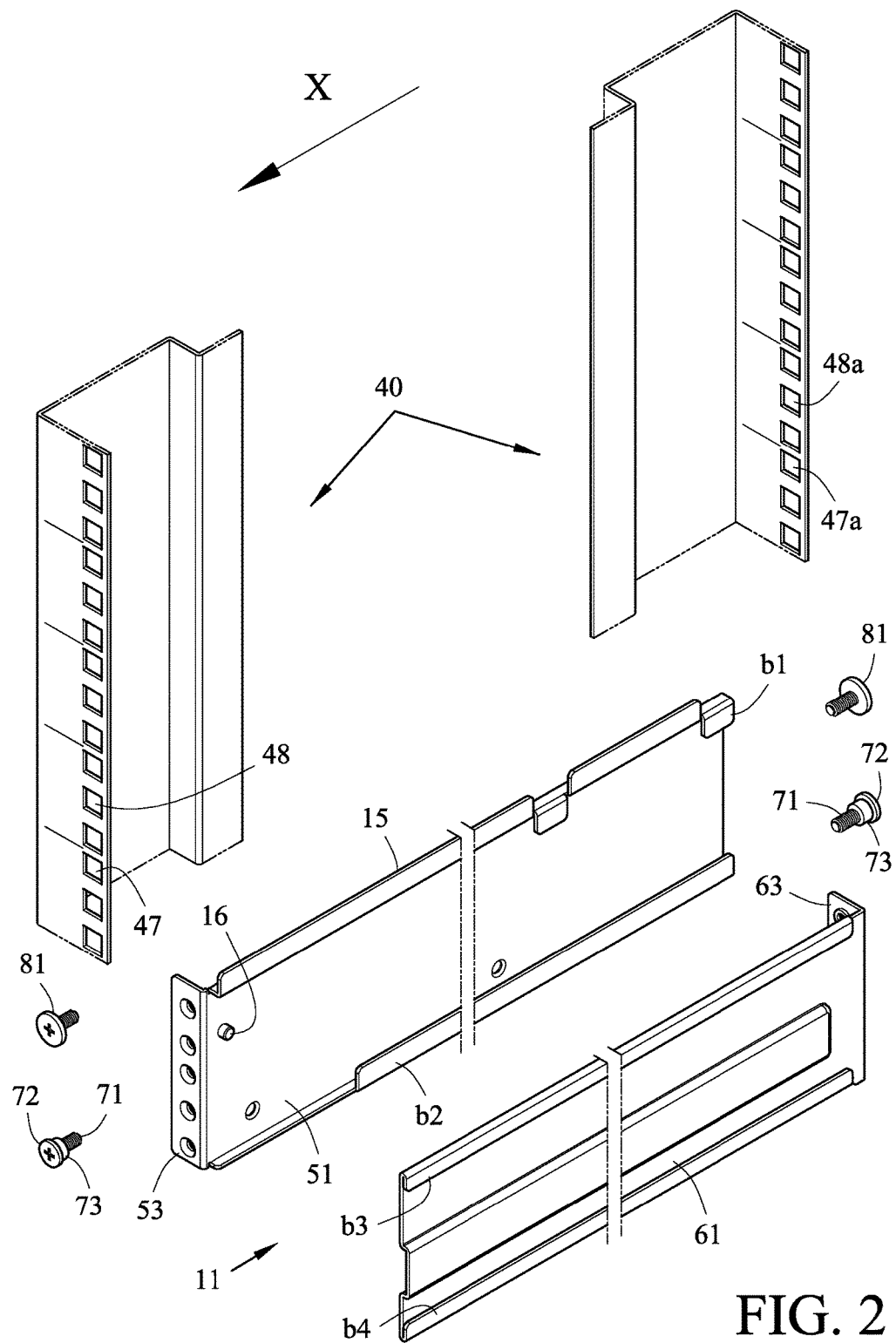
FIG. 2 is a first partially exploded view showing the first preferred embodiment of the invention.
Figure 3:
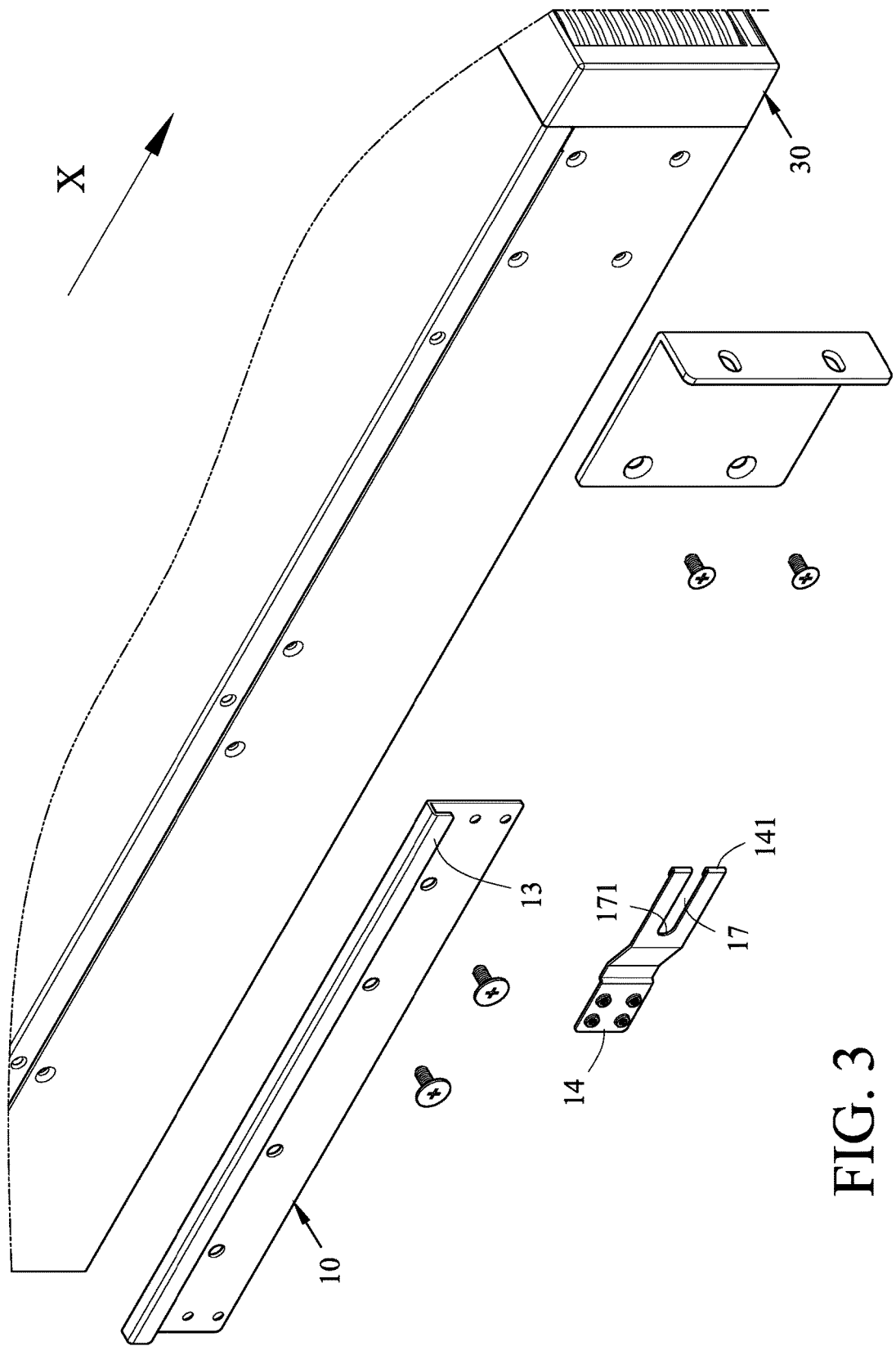
FIG. 3 is a second partially exploded view showing the first preferred embodiment of the invention.
Figure 4:
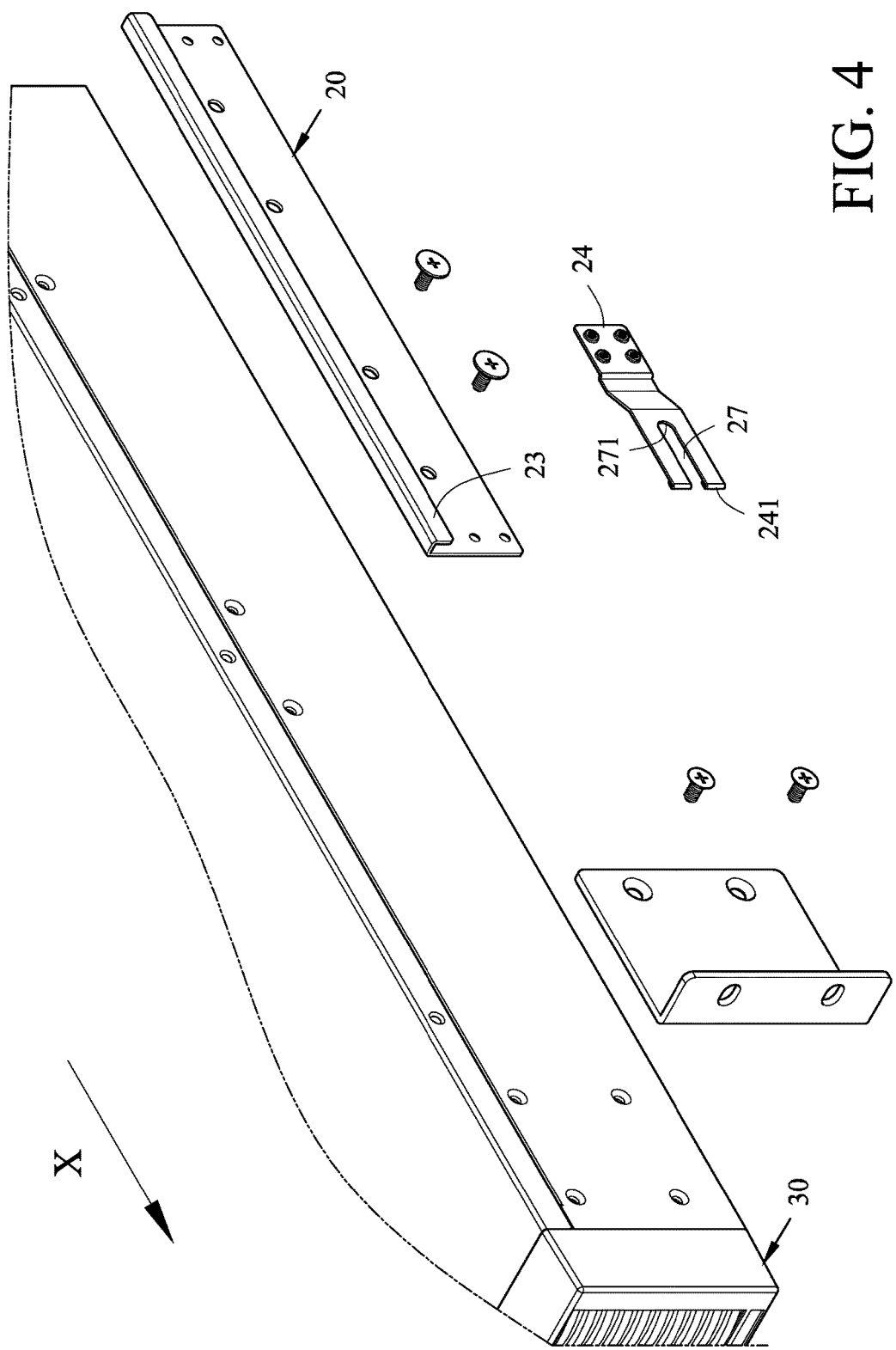
FIG. 4 is a third partially exploded view showing the first preferred embodiment of the invention.
Figure 5:
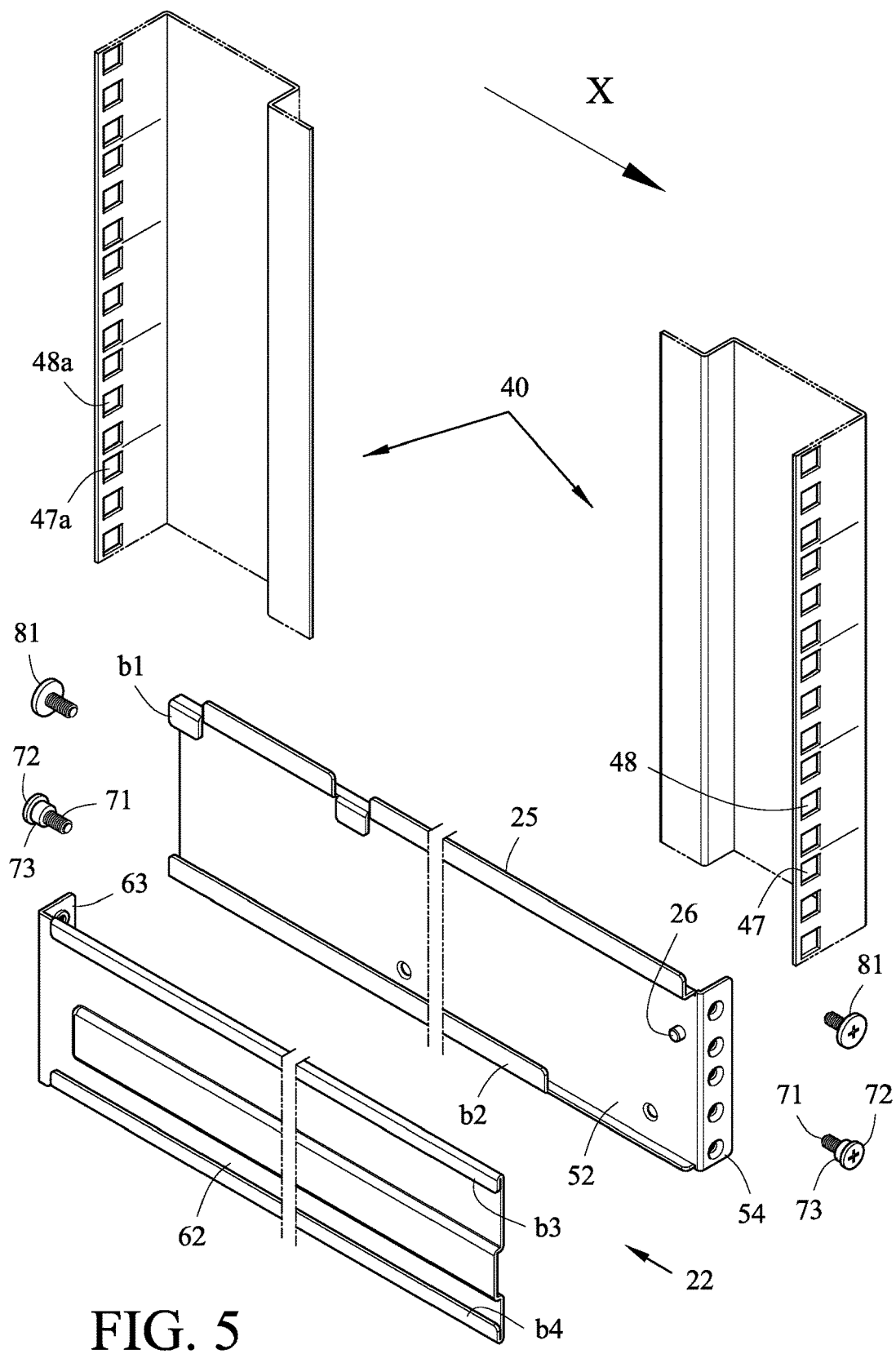
FIG. 5 is a fourth partially exploded view showing the first preferred embodiment of the invention.

Referring to FIGS. 1 to 5, a suspension type sliding bracket in accordance with a first embodiment of the invention comprises a first sliding rail 10, a first bracket 11, a second sliding rail 20 and a second bracket 22; the first sliding rail 10 has a first U-shaped portion 13, a front-end portion of the first sliding rail 10 can provided with a first locating plate 14; the first bracket 11 has a first L-shaped portion 15, a front-end portion of the first bracket 11 can provided with a first locating post 16; the second sliding rail 20 has a second U-shaped portion 23, a device 30 can be fixed between the first sliding rail 10 and the second sliding rail 20; the second bracket 22 has a second L-shaped portion 25, the first and second brackets 11, 22 can be fixed on a first level space of a rack 40; wherein the first U-shaped portion 13 can slide on the first L-shaped portion 15, the second U-shaped portion 23 can slide on the second L-shaped portion 25; when the device 30 is pulled out, the first locating post 16 will enter a first slot 17 of the first locating plate 14, and the first locating post 16 will block a closure portion 171 of the first slot 17, therefore the first sliding rail 10 can form a first anti-dropping position to stop slide; and the first slot 17 can escape from the first locating post 16 when an extension portion 141 of the first locating plate 14 is pressed, therefore the device 30 can be completely pulled out.

Figure 7:
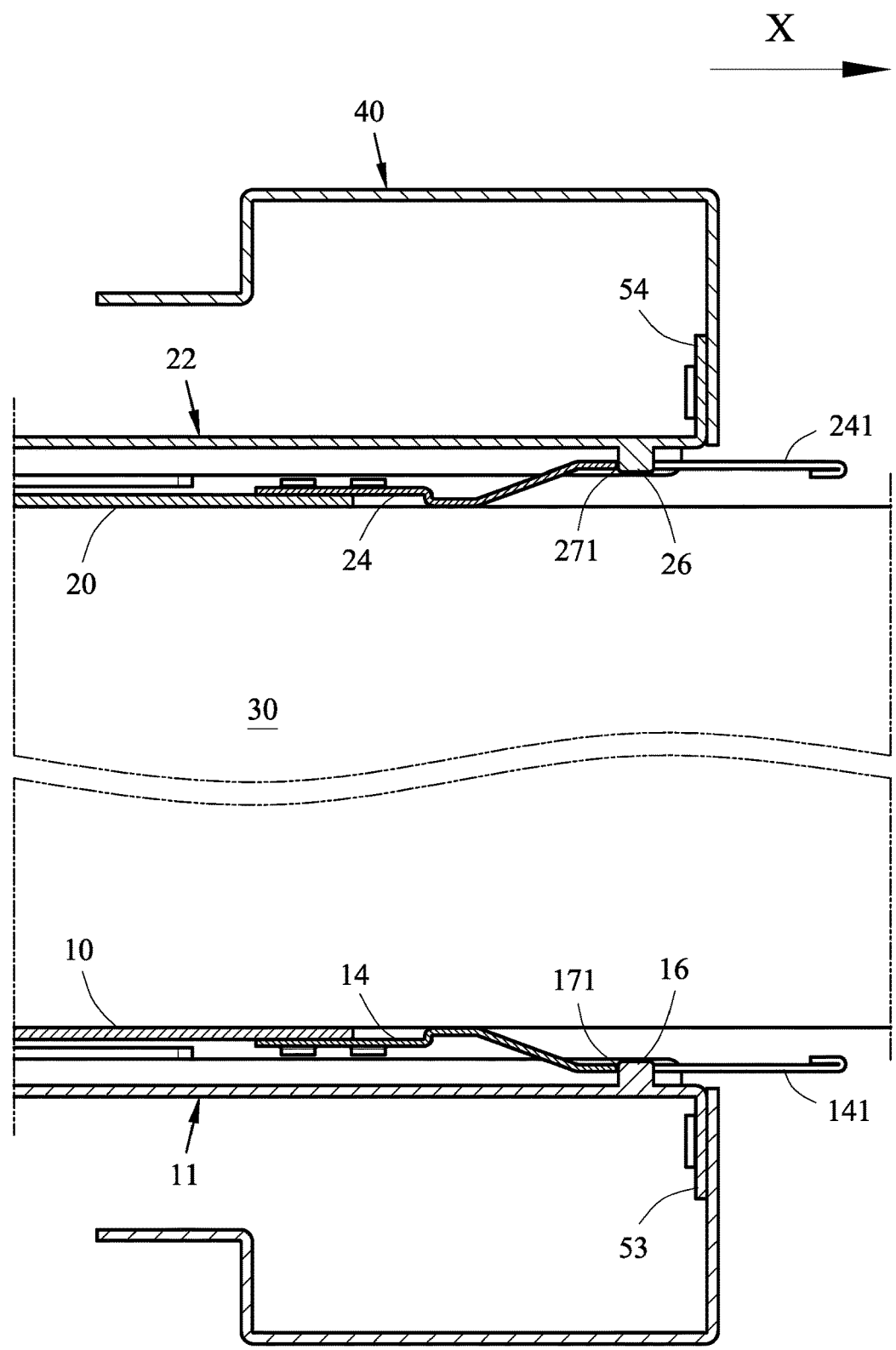
FIG. 7 is a cross-sectional view along a line B-B of FIG. 1 showing the first preferred embodiment of the invention.
Figure 8:
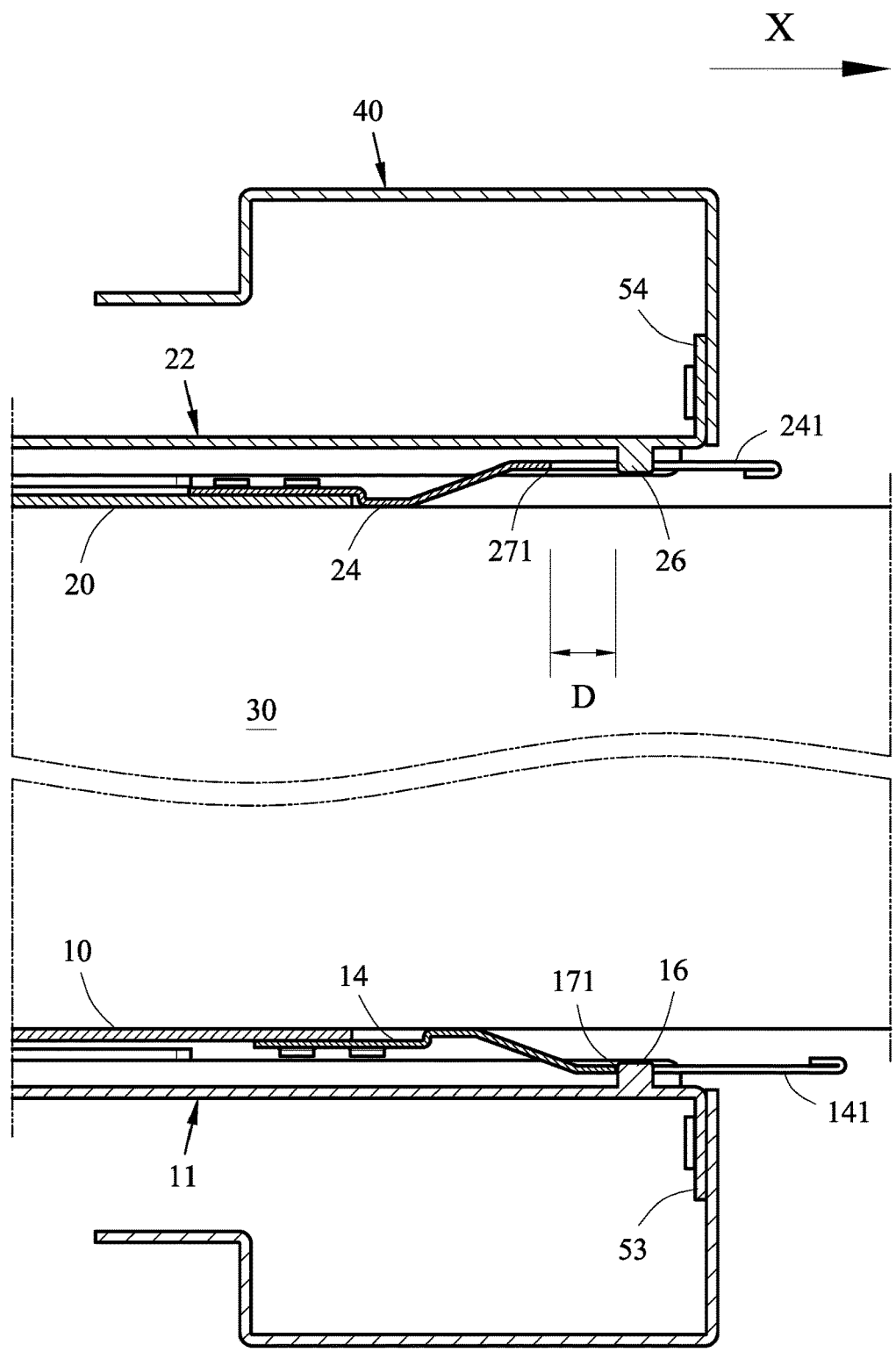
FIG. 8 is another cross-sectional view along a line B-B of FIG. 1 showing the first preferred embodiment of the invention.

Examples of a variation of the second sliding rail 20 and a variation of the second bracket 22, a front-end portion of the second sliding rail 20 can provided with a second locating plate 24, a front-end portion of the second bracket 22 can provided with a second locating post 26; when the device 30 is pulled out, the second locating post 26 will enter a second slot 27 of the second locating plate 24, and the second locating post 26 will block a closure portion 271 of the second slot 27, therefore the second sliding rail 20 can stop slide (as shown in FIG. 7); and the second slot 27 can escape from the second locating post 26 when an extension portion 241 of the second locating plate 24 is pressed. Moreover, the closure portion 171 of the first slot 17 and the closure portion 271 of the second slot 27 further have a distance D in sliding direction X, therefore the second sliding rail 20 can form a second anti-dropping position (as shown in FIG. 8).

Figure 6:
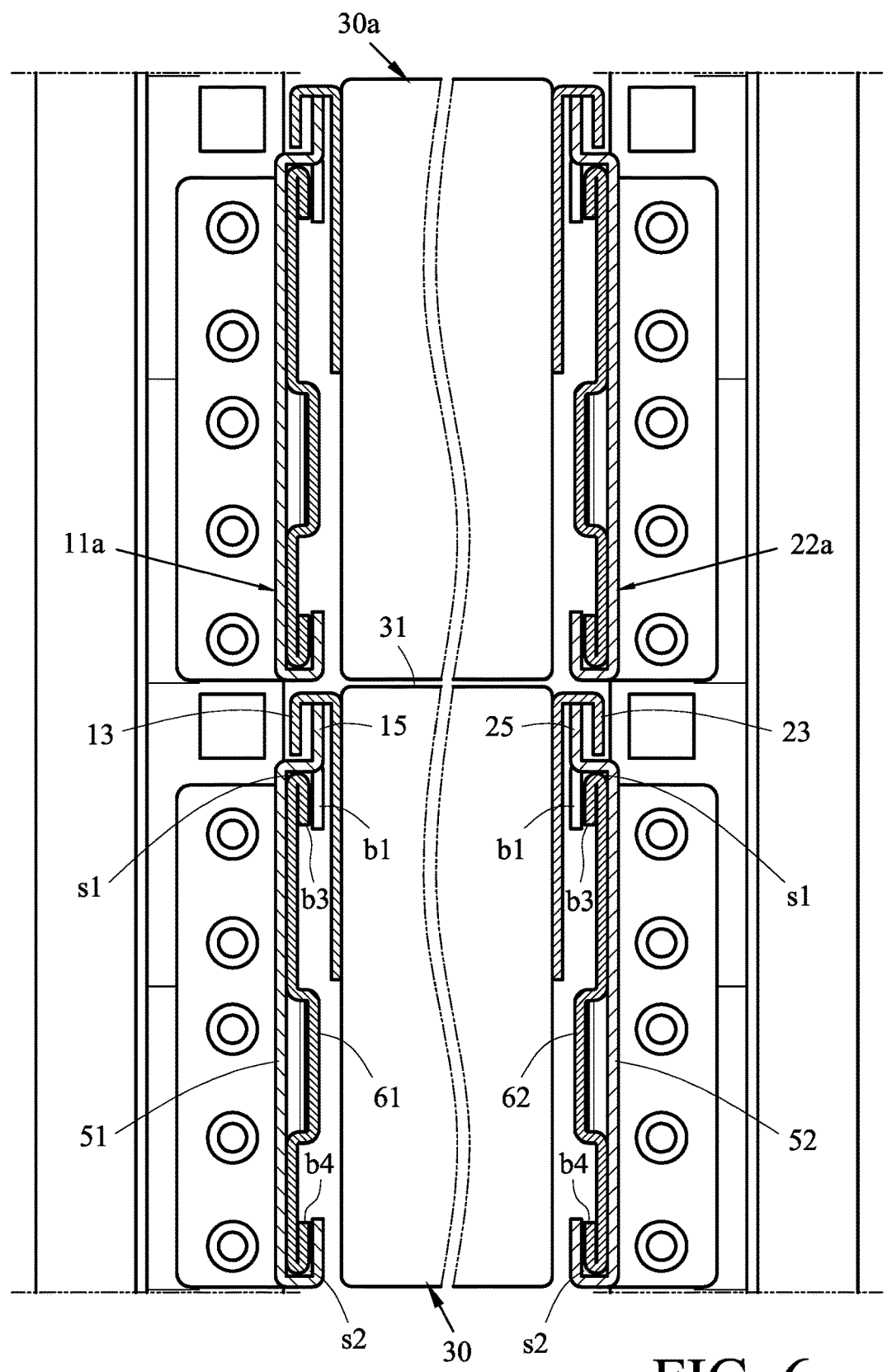
FIG. 6 is a cross-sectional view along a line A-A of FIG. 1 showing the first preferred embodiment of the invention.

Examples of a first variation of the suspension type sliding bracket, the position of the first U-shaped portion 13 can be lower than a top surface 31 of the device 30, and the position of the second U-shaped portion 23 can be lower than the top surface 31 of the device 30 (as shown in FIG. 6), the suspension type sliding bracket can reduce the height of each level space; when another device 30a is disposed on a second level space of the rack 40, another first bracket 11a will not interfere to the first sliding rail 10, and another second bracket 22a will not interfere to the second sliding rail 20.

Examples of a second variation of the suspension type sliding bracket, the first bracket 11 has a first master bracket 51 and a first extension bracket 61, a fixing portion 53 of the first master bracket 51 and a fixing portion 63 of the first extension bracket 61 can be fixed on the rack 40; the second bracket 22 has a second master bracket 52 and a second extension bracket 62, a fixing portion 54 of the second master bracket 52 and a fixing portion 64 of the second extension bracket 62 can be fixed on the rack 40.

Examples of a third variation of the suspension type sliding bracket, each of the first and second master brackets 51, 52 has at least one bending portion b1 and at least one bending portion b2, each bending portion b1 can form a rail space s1, each bending portion b2 can form another rail space s2; each of the first and second extension brackets 61, 62 has at least one bending portion b3 and at least one bending portion b4; wherein each bending portion b3 can insert into each rail space s1, each bending portion b4 can insert into each rail space s2.

Figure 9:
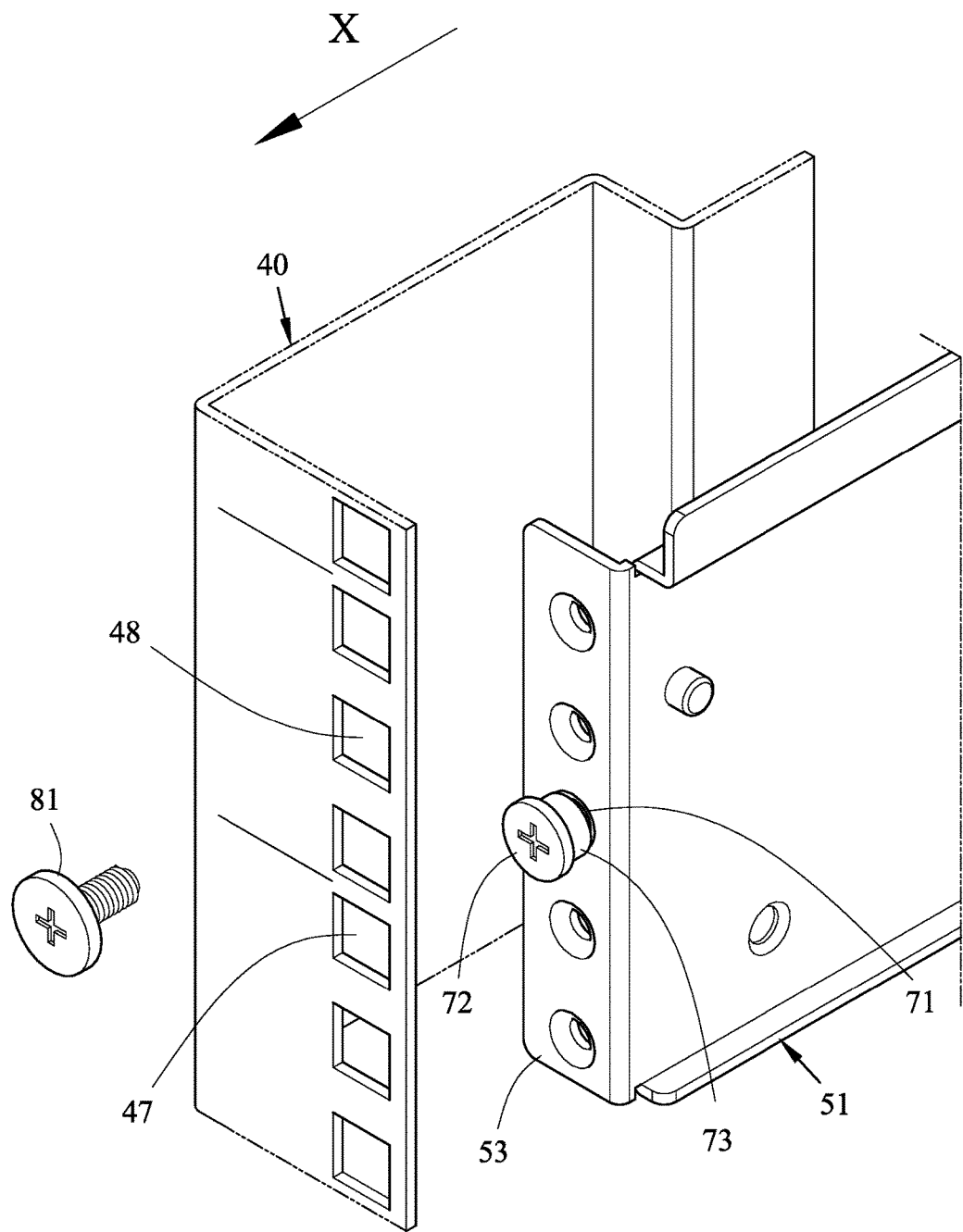
FIG. 9 is a first assemble diagram illustrating a single operator to assemble the first preferred embodiment of the invention.
Figure 10:
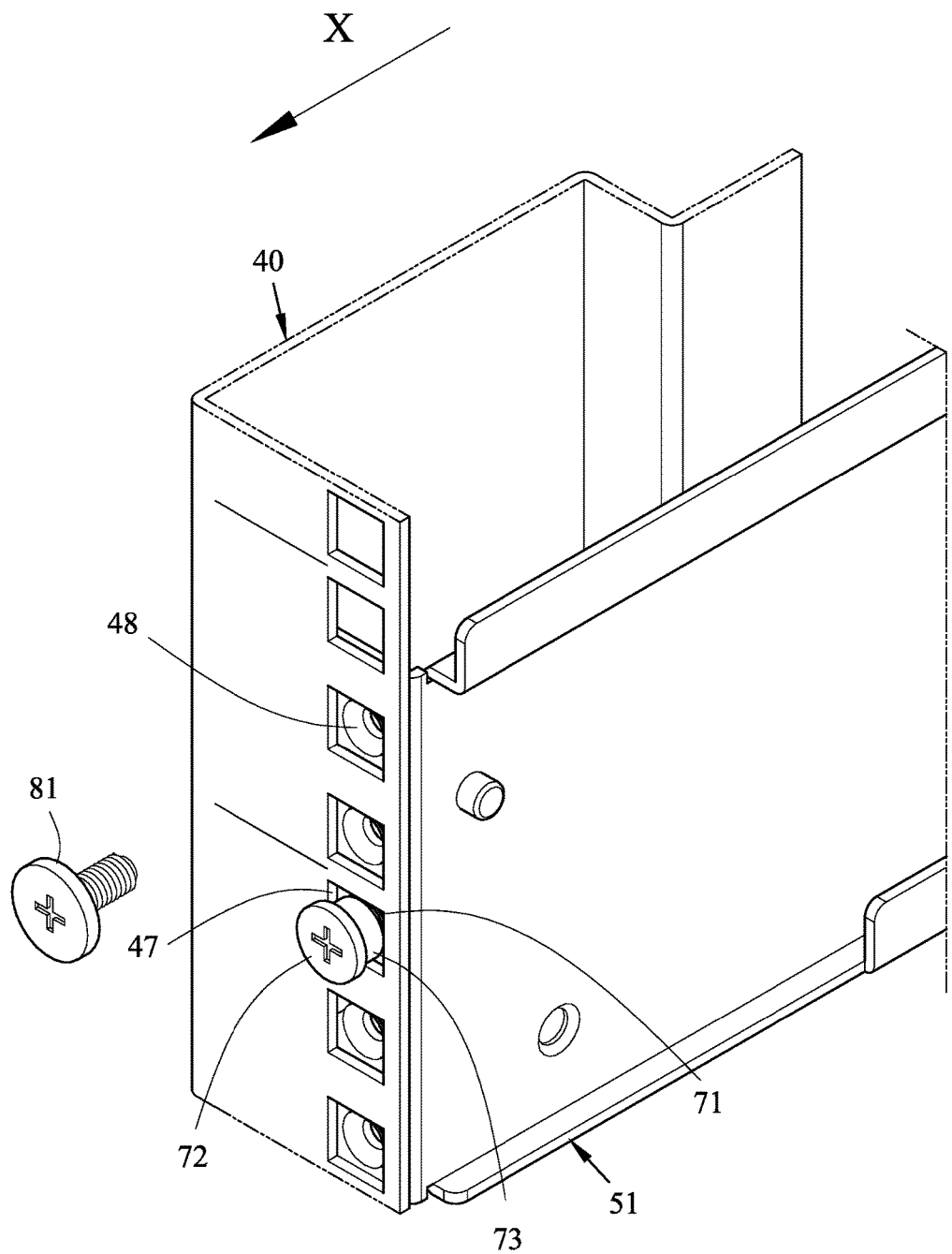
FIG. 10 is a second assemble diagram illustrating a single operator to assemble the first preferred embodiment of the invention.
Figure 11:
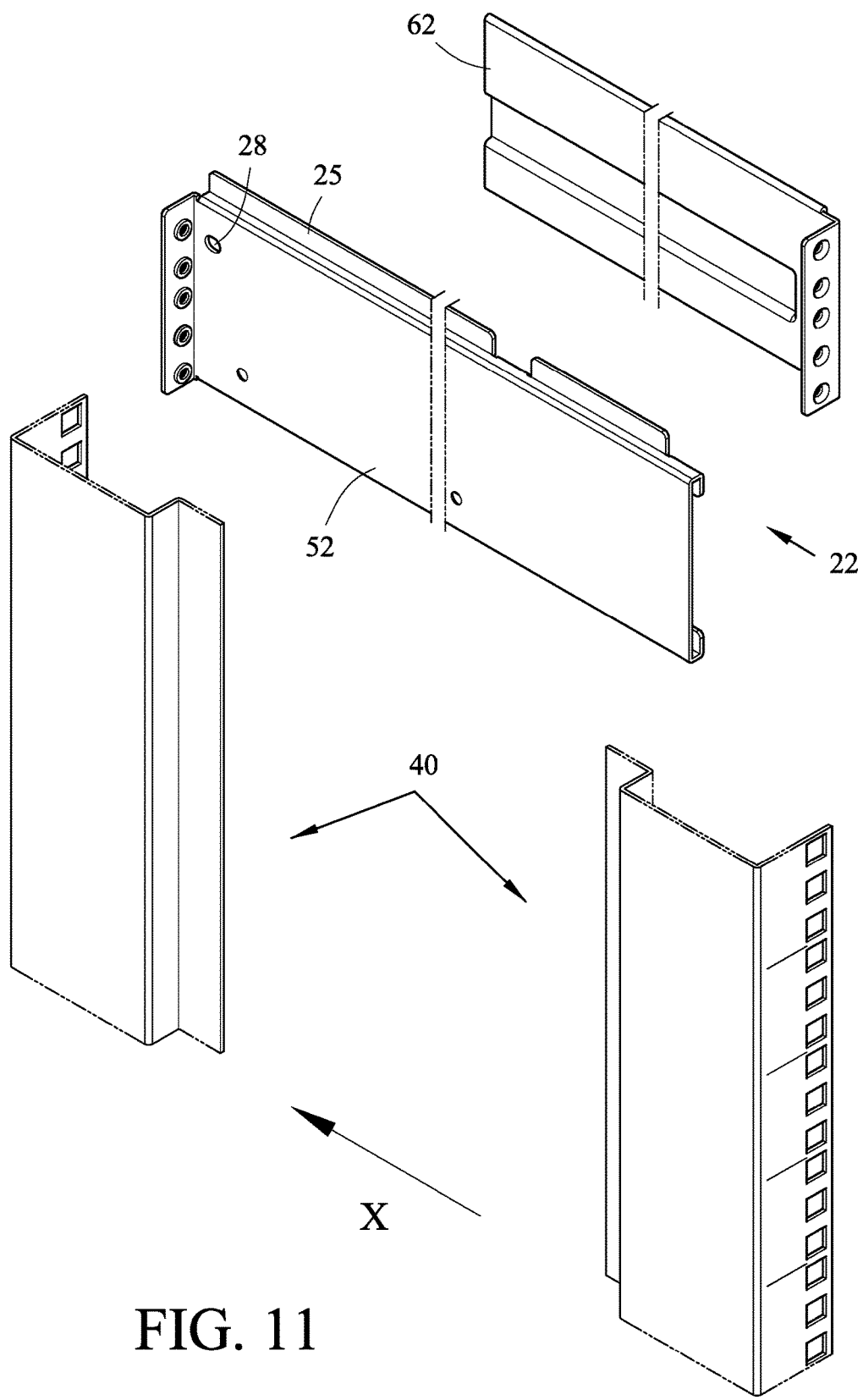
FIG. 11 is a first partially exploded view showing the second preferred embodiment of the invention.
Figure 12:
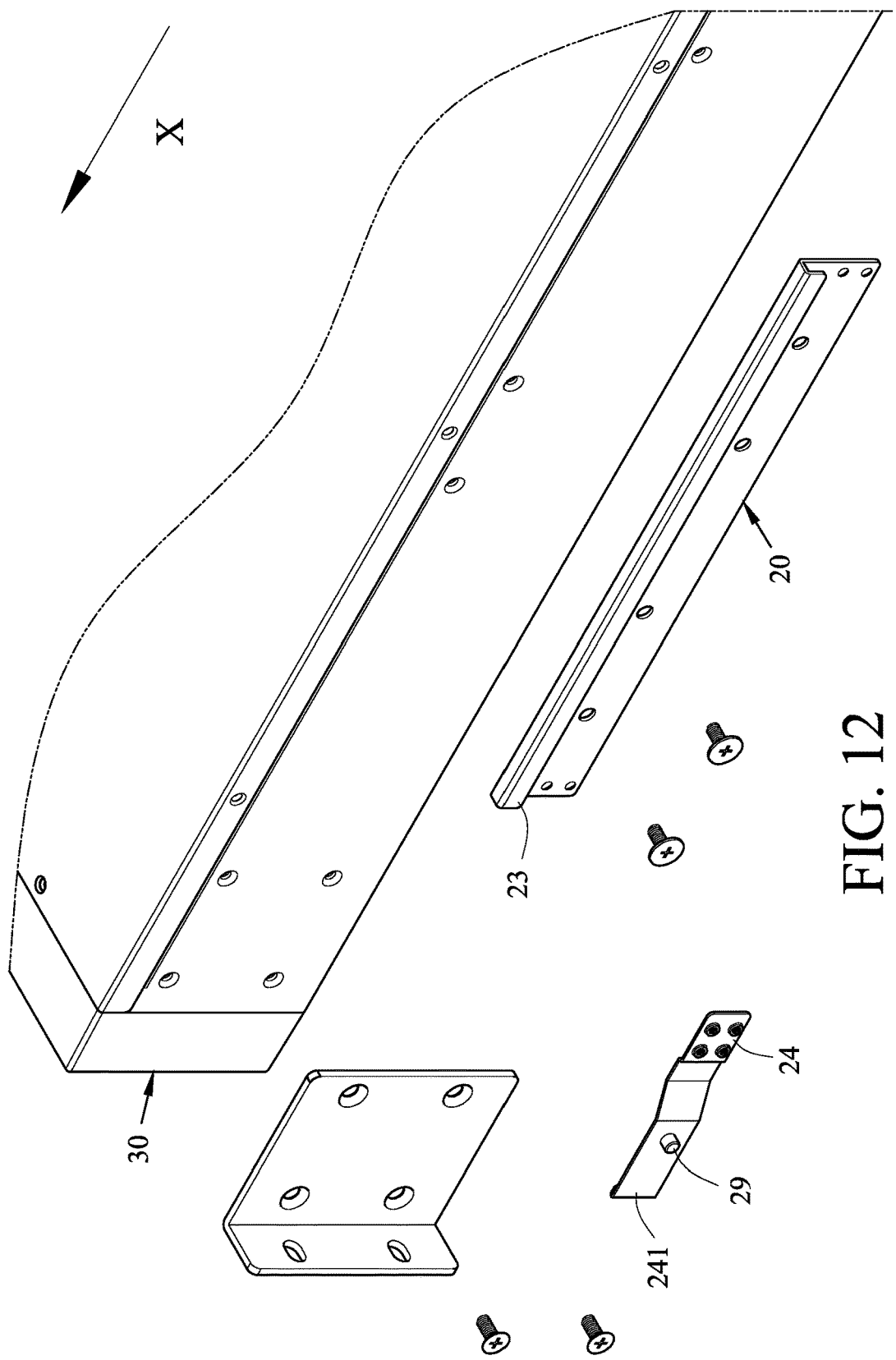
FIG. 12 is a second partially exploded view showing the second preferred embodiment of the invention.
Figure 13:
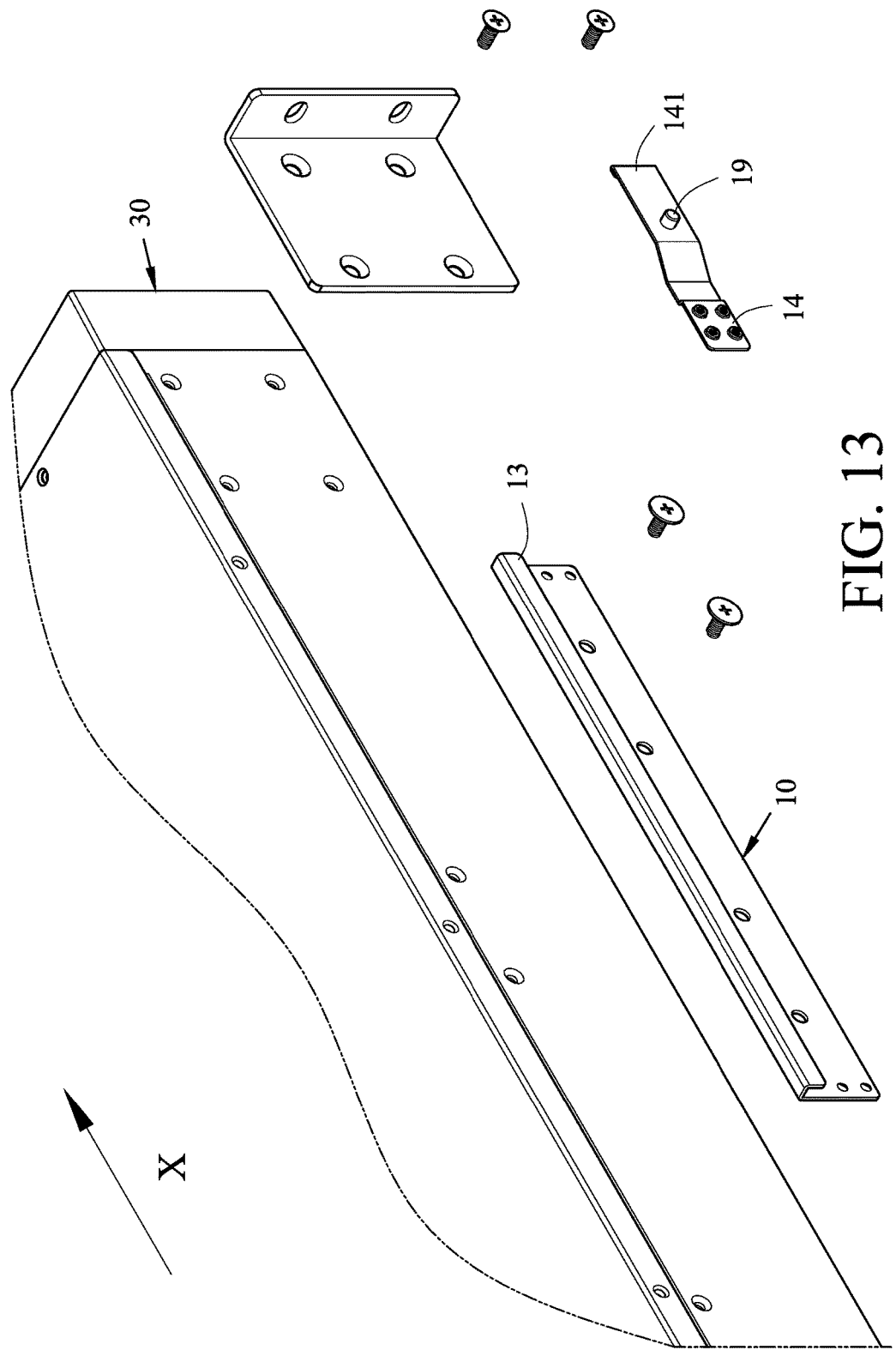
FIG. 13 is a third partially exploded view showing the second preferred embodiment of the invention.
Figure 14:
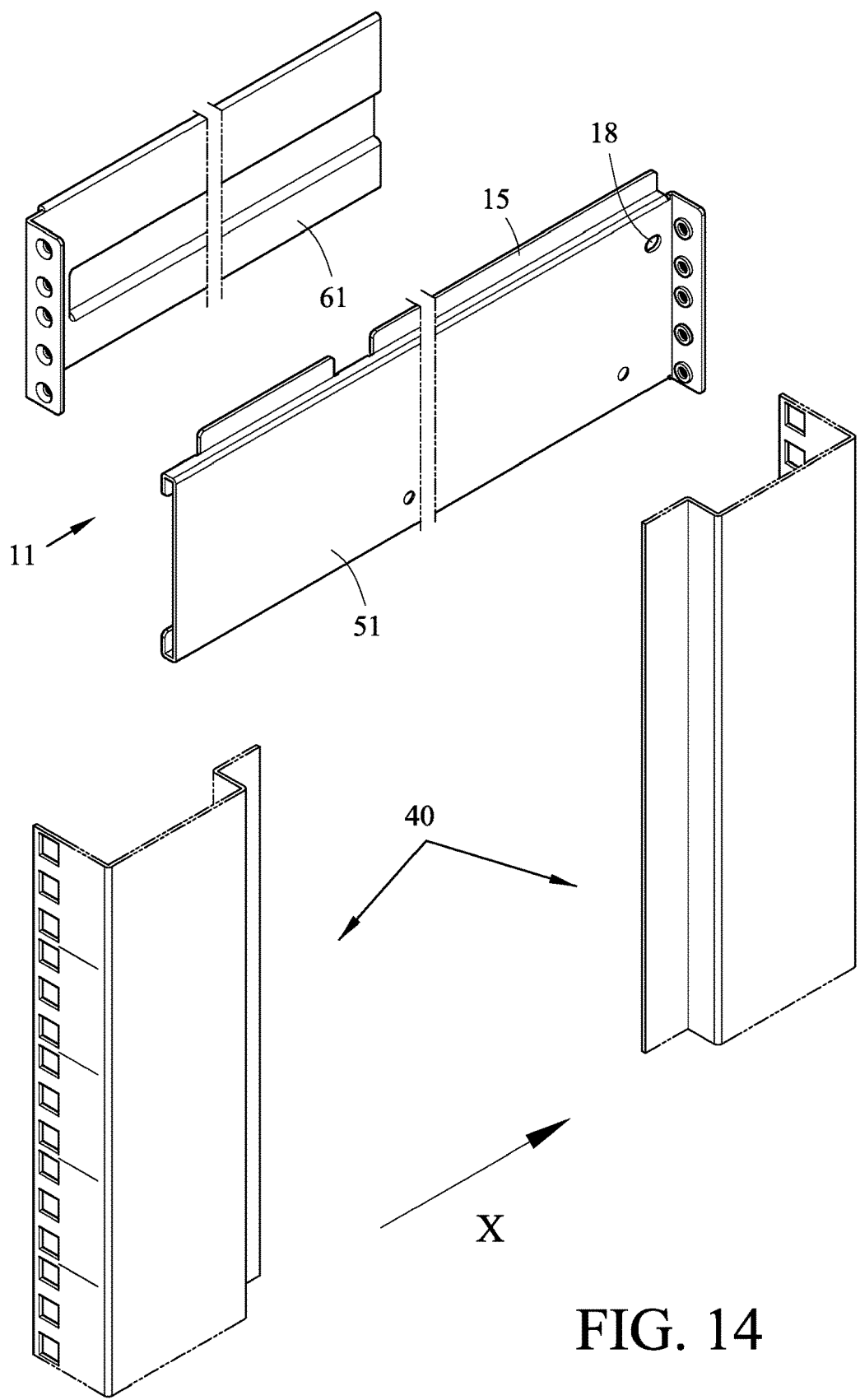
FIG. 14 is a fourth partially exploded view showing the second preferred embodiment of the invention.

Examples of a fourth variation of the suspension type sliding bracket, a first support screw 71 can be screw fixed on the fixing portion 53 of the first master bracket 51, a screw head 72 of the first support screw 71 can pass through a fixing hole 47 of the rack 40, the fixing hole 47 can support a neck 73 of the first support screw 71; and at least one fixing screw 81 can pass through another fixing hole 48 of the rack 40, the fixing portion 53 of the first master bracket 51 can use the fixing screw 81 to fix on the rack 40 (as shown in FIG. 9 and FIG. 10). Thus, a single operator can proceed to fix the suspension type sliding bracket to easy assemble. In another way, the first support screw 71 can be screw fixed on the fixing portion 63 of the first extension bracket 61, the screw head 72 of the first support screw 71 can pass through a fixing hole 47a of the rack 40, the fixing hole 47a can support a neck 73 of the first support screw 71; and at least one fixing screw 81 can pass through another fixing hole 48a of the rack 40, the fixing portion 63 of the first extension bracket 61 can use the fixing screw 81 to fix on the rack 40.

Referring to FIGS. 11 to 14, a suspension type sliding bracket in accordance with a second embodiment of the invention comprises a first sliding rail 10, a first bracket 11, a second sliding rail 20 and a second bracket 22; the first sliding rail 10 has a first U-shaped portion 13, a front-end portion of the first sliding rail 10 can provided with a first locating plate 14; the first bracket 11 has a first L-shaped portion 15, a front-end portion of the first bracket 11 can provided with a first locating hole 18; the second sliding rail 20 has a second U-shaped portion 23, a device 30 can be fixed between the first sliding rail 10 and the second sliding rail 20; the second bracket 22 has a second L-shaped portion 25, the first and second brackets 11, 22 can be fixed on a first level space of a rack 40 (as shown in FIG. 1); wherein the first U-shaped portion 13 can slide on the first L-shaped portion 15, the second U-shaped portion 23 can slide on the second L-shaped portion 25; when the device 30 is pulled out, a first locating post 19 of the first locating plate 14 will enter the first locating hole 18, therefore the first sliding rail 10 can form a first anti-dropping position to stop slide; and the first locating post 19 can escape from the first locating hole 18 when an extension portion 141 of the first locating plate 14 is pressed, therefore the device 30 can be completely pulled out.

Figure 15:
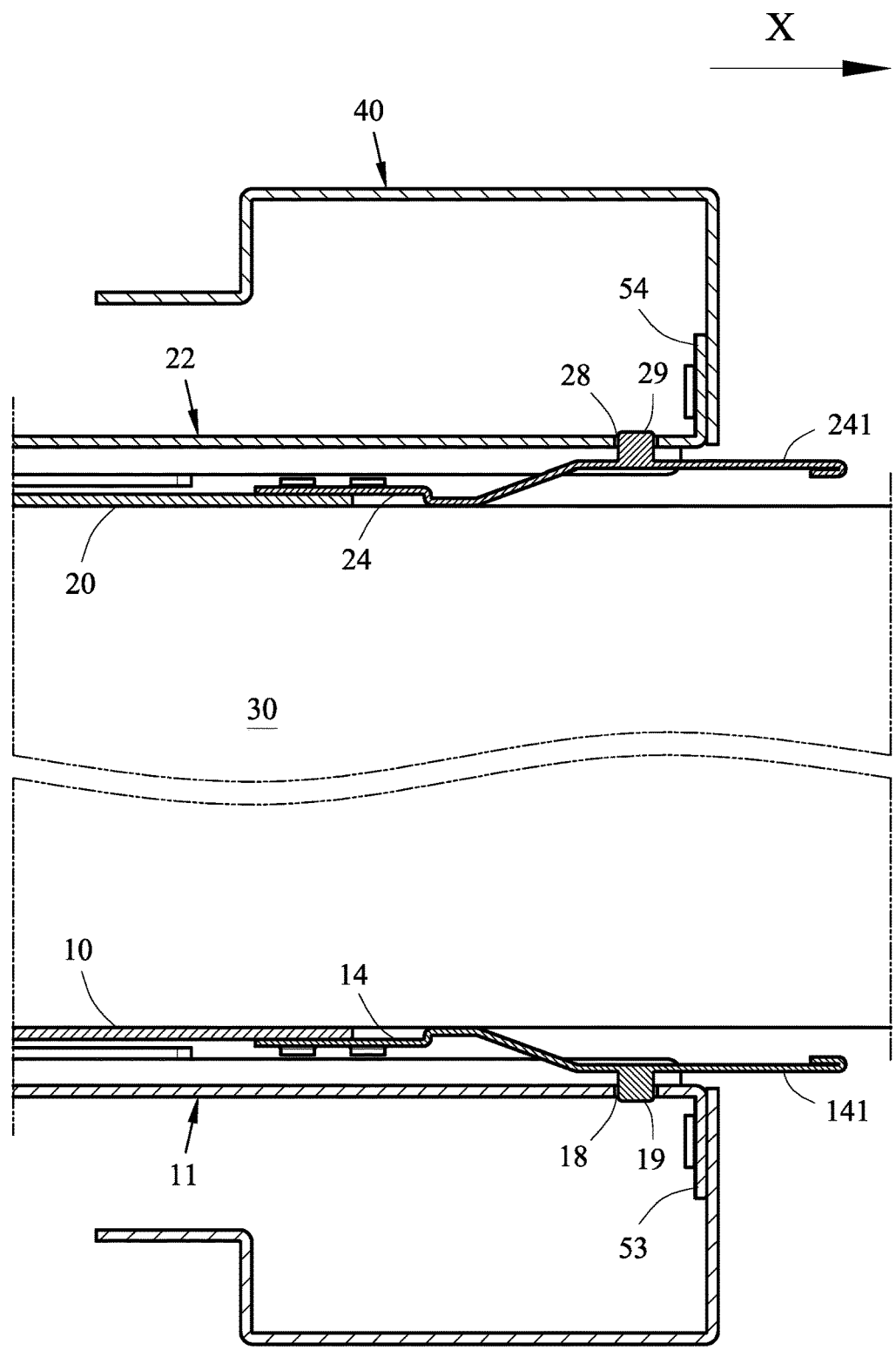
FIG. 15 is a cross-sectional view along a line B-B of FIG. 1 showing the second preferred embodiment of the invention.
Figure 16:
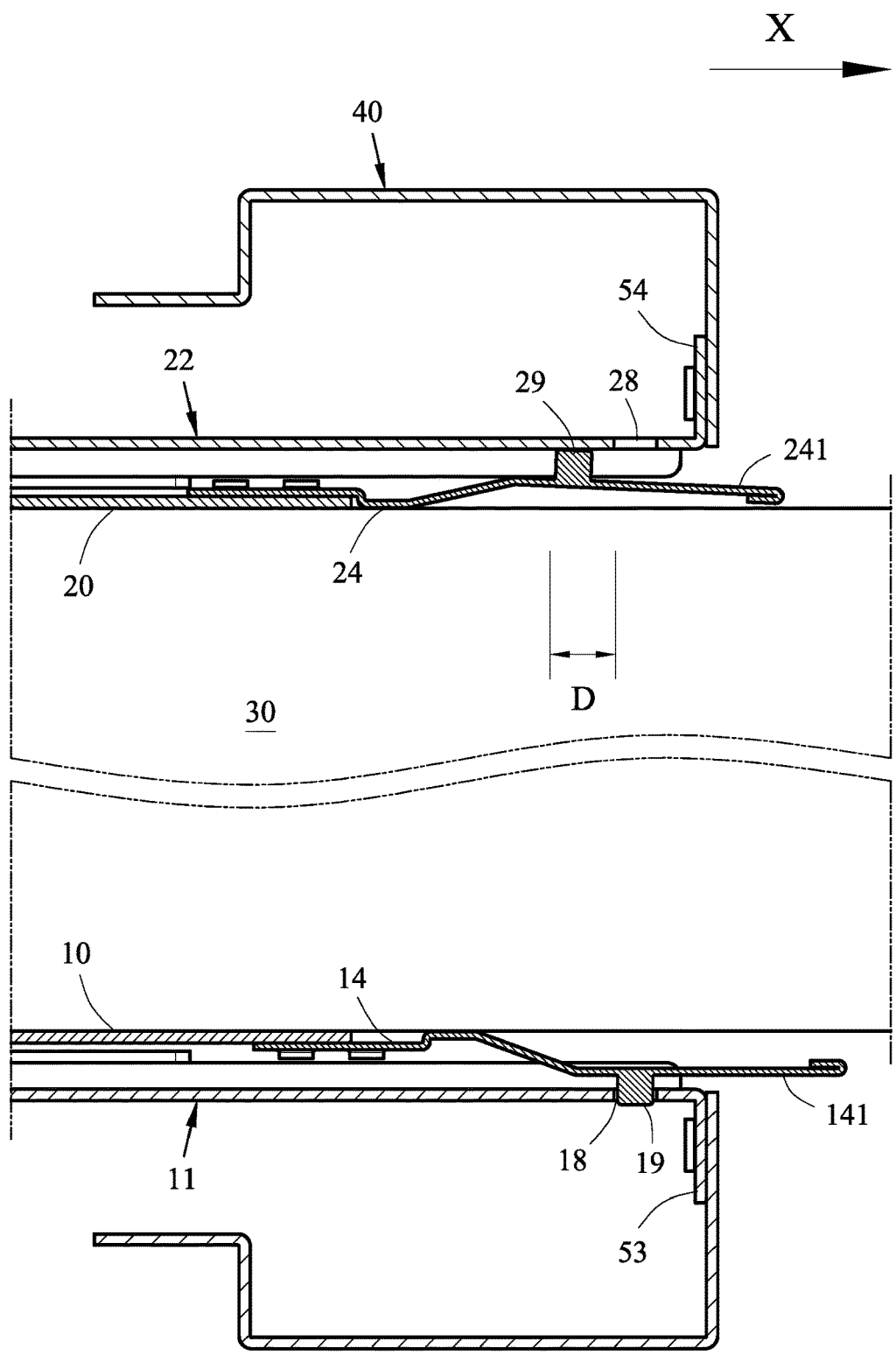
FIG. 16 is another cross-sectional view along a line B-B of FIG. 1 showing the second preferred embodiment of the invention.
Figure 17:
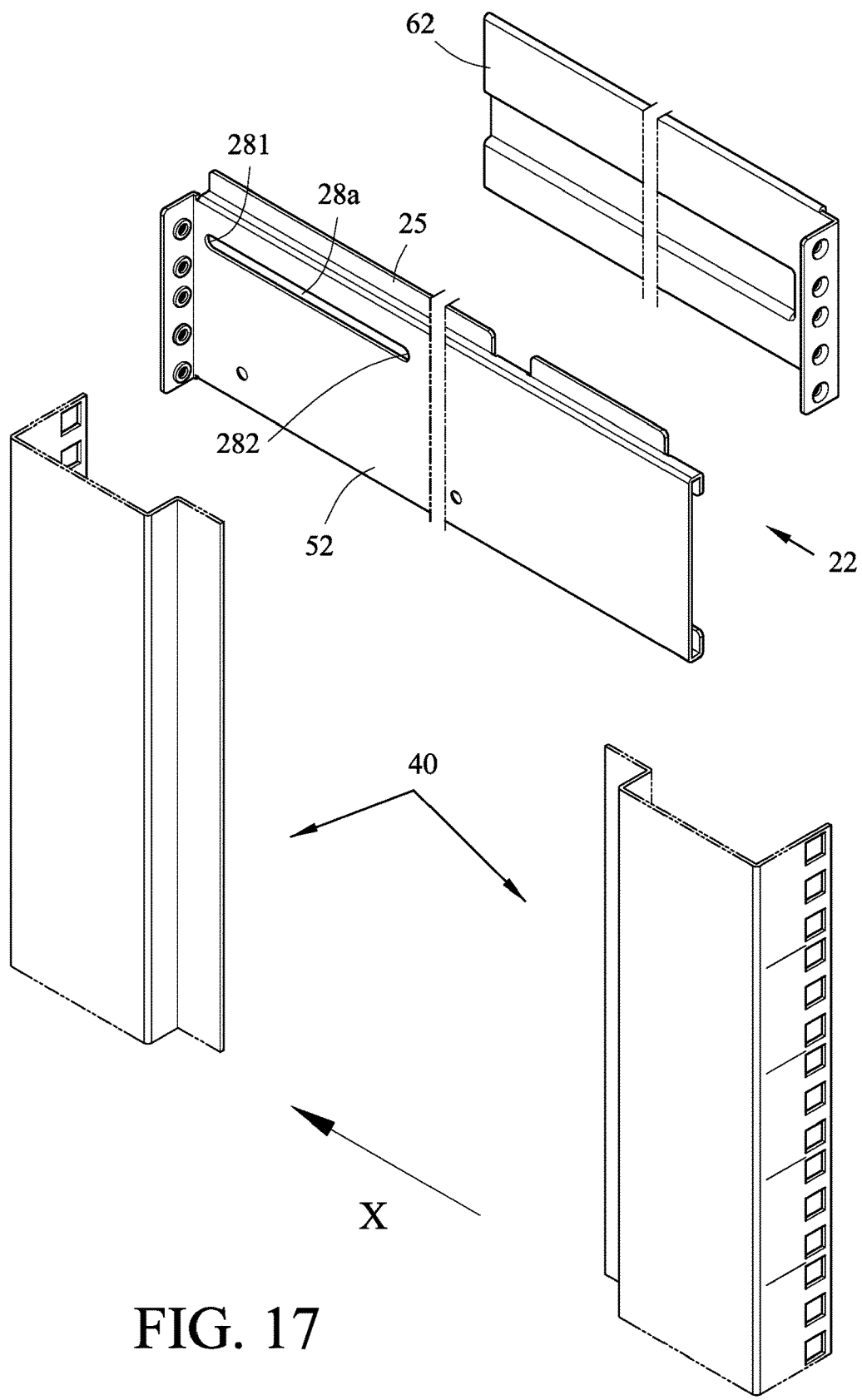
FIG. 17 is a first partially exploded view showing the third preferred embodiment of the invention.
Figure 18:
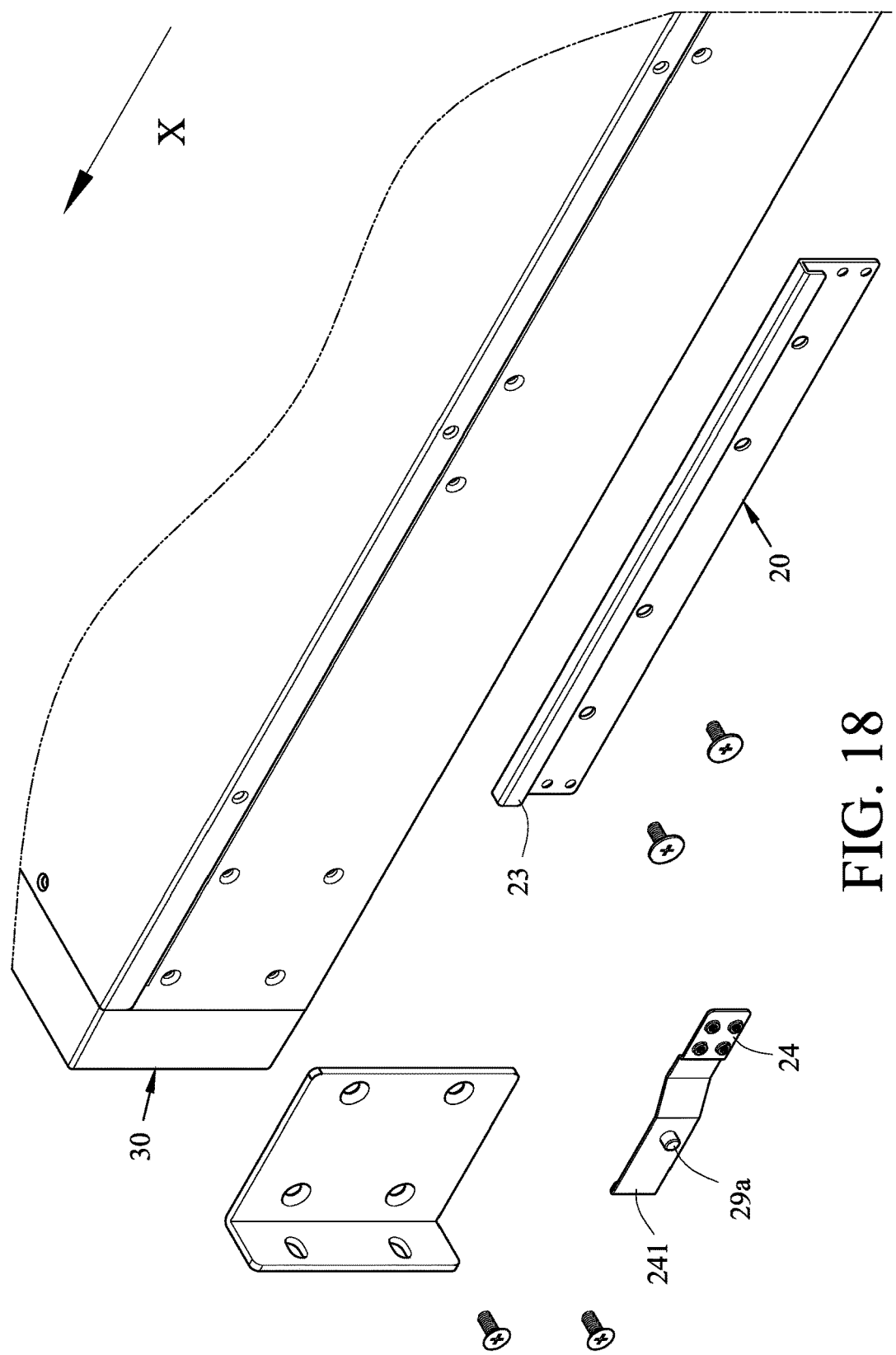
FIG. 18 is a second partially exploded view showing the third preferred embodiment of the invention.
Figure 19:
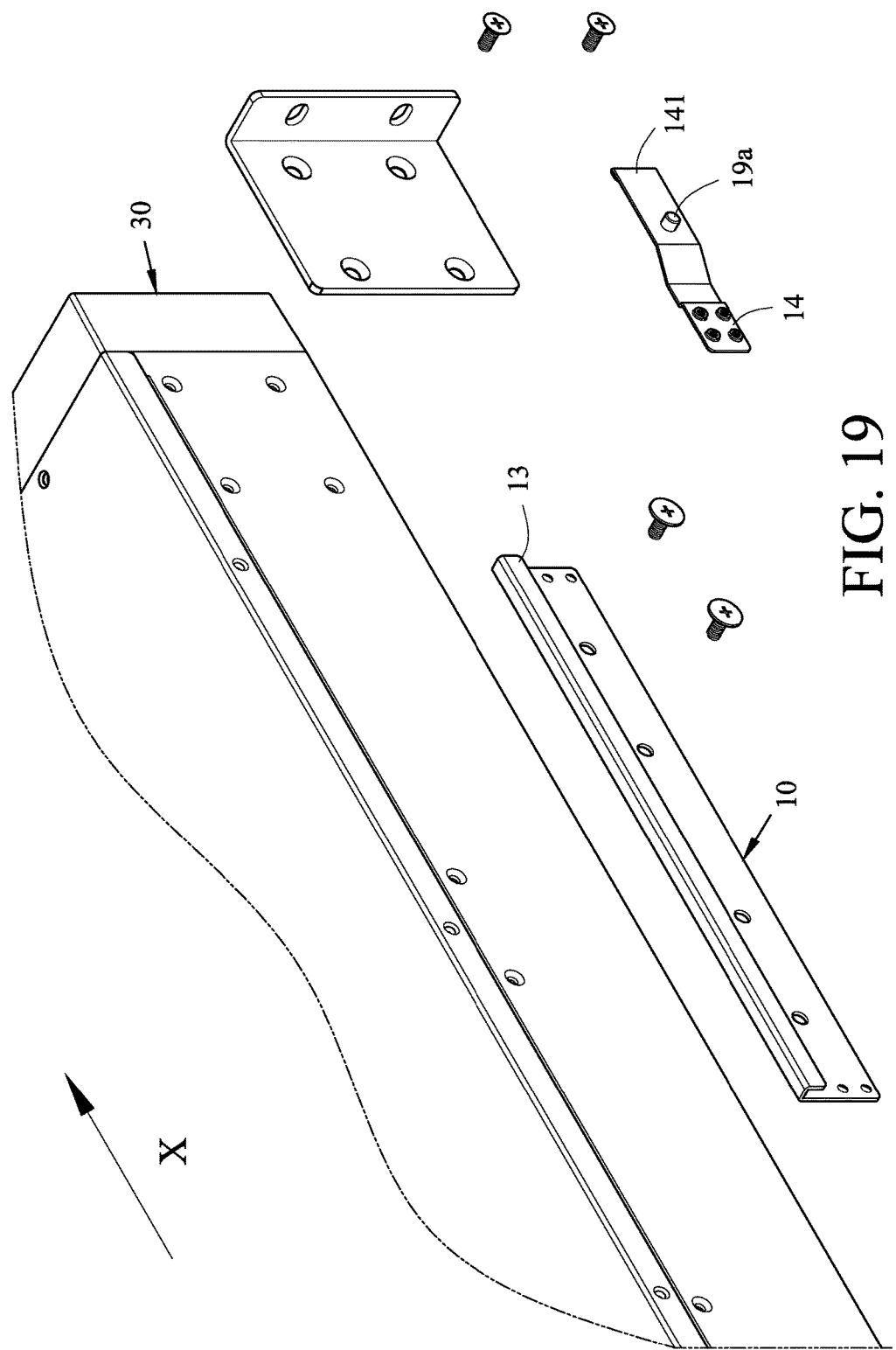
FIG. 19 is a third partially exploded view showing the third preferred embodiment of the invention.
Figure 20:
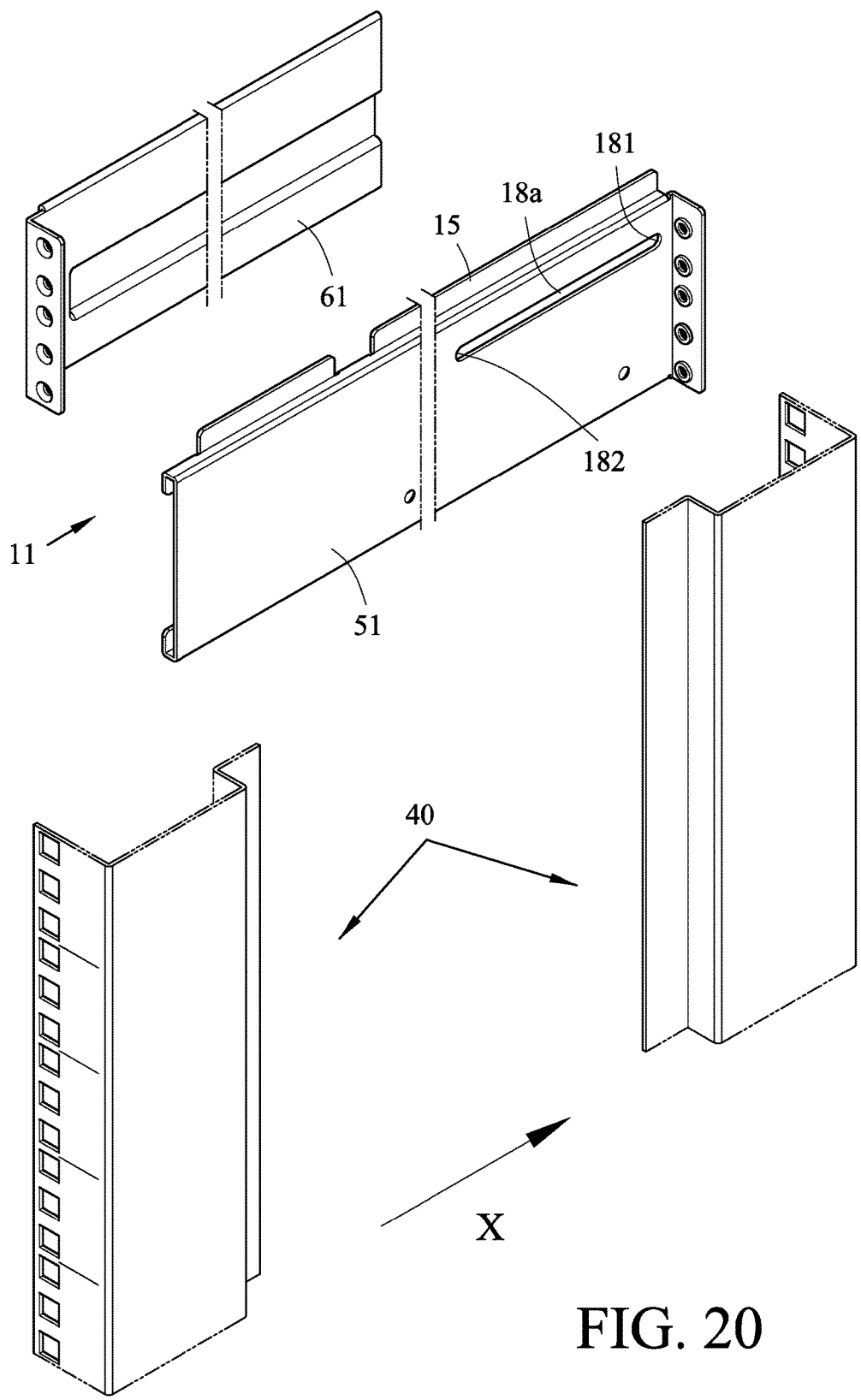
FIG. 20 is a fourth partially exploded view showing the third preferred embodiment of the invention.
Figure 21:
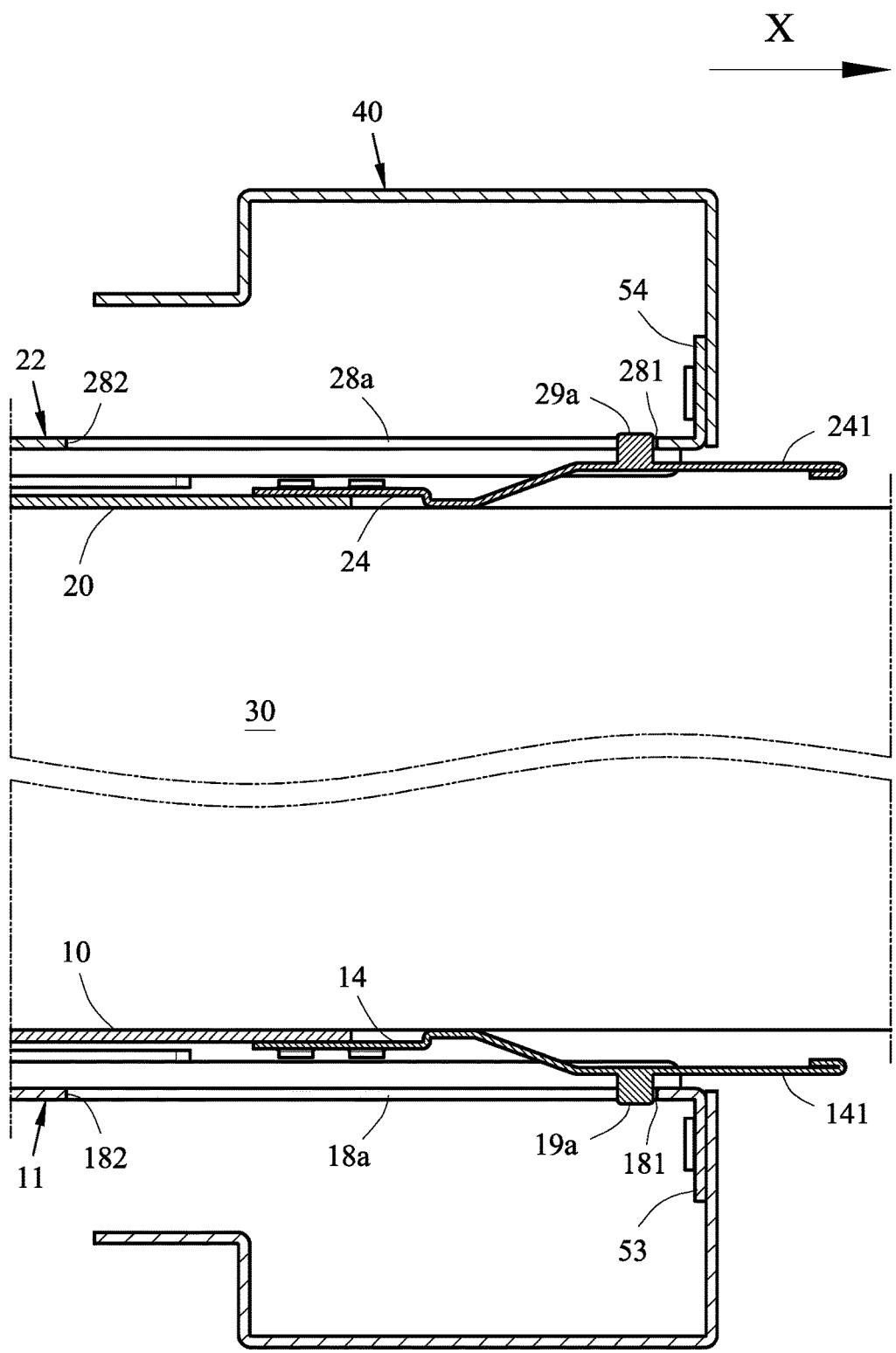
FIG. 21 is a cross-sectional view along a line B-B of FIG. 1 showing the third preferred embodiment of the invention.

Examples of a variation of the second sliding rail 20 and a variation of the second bracket 22, a front-end portion of the second sliding rail 20 can provided with a second locating plate 24, a front-end portion of the second bracket 22 can provided with a second locating hole 28; when the device 30 is pulled out, a second locating post 29 of the second locating plate 24 will enter a second locating hole 28, therefore the second sliding rail 20 can stop slide (as shown in FIG. 15); and the second locating post 29 can escape from the second locating hole 28 when an extension portion 241 of the second locating plate 24 is pressed. Moreover, the first locating post 19 and the second locating post 29 further have a distance D in sliding direction X, therefore the second sliding rail 20 can form a second anti-dropping position (as shown in FIG. 16).

Referring to FIGS. 17 to 21, a suspension type sliding bracket in accordance with a third embodiment of the invention comprises a first sliding rail 10, a first bracket 11, a second sliding rail 20 and a second bracket 22; the first sliding rail 10 has a first U-shaped portion 13, a front-end portion of the first sliding rail 10 can provided with a first locating plate 14; the first bracket 11 has a first L-shaped portion 15, a front-end portion of the first bracket 11 can provided with a first elongated locating hole 18a, a first locating post 19a of the first locating plate 14 is located in the first elongated locating hole 18a; the second sliding rail 20 has a second U-shaped portion 23, a device 30 can be fixed between the first sliding rail 10 and the second sliding rail 20; the second bracket 22 has a second L-shaped portion 25, the first and second brackets 11, 22 can be fixed on a first level space of a rack 40 (as shown in FIG. 1); wherein the first U-shaped portion 13 can slide on the first L-shaped portion 15, the second U-shaped portion 23 can slide on the second L-shaped portion 25; when the device 30 is pulled out, a front-end portion 181 of the first elongated locating hole 18a will block the first locating post 19a, therefore the first sliding rail 10 can form a first anti-dropping position to stop slide; and the first locating post 19a can escape from the first elongated locating hole 18a when an extension portion 141 of the first locating plate 14 is pressed. When the device 30 is re-pushed into the rack 40, the first locating post 19a will enter the first elongated locating hole 18a; and a back-end portion 182 of the first elongated locating hole 18a will block the first locating post 19a when continuously push the device 30, therefore the pushed position of the device 30 can be limited.

Examples of a variation of the second sliding rail 20 and a variation of the second bracket 22, a front-end portion of the second sliding rail 20 can provided with a second locating plate 24, a front-end portion of the second bracket 22 can provided with a second elongated locating hole 28a, a second locating post 29a of the second locating plate 24 is located in the second elongated locating hole 28a; when the device 30 is pulled out, a front-end portion 281 of the second elongated locating hole 28a will block the second locating post 29a, therefore the second sliding rail 20 can stop slide; and the second locating post 29a can escape from the second elongated locating hole 28a when an extension portion 241 of the second locating plate 24 is pressed. When the device 30 is re-pushed into the rack 40, the second locating post 29a will enter the second elongated locating hole 28a; and a back-end portion 282 of the second elongated locating hole 28a will block the second locating post 29a when continuously push the device 30.

What is claimed is:

1. A suspension type sliding bracket having anti-dropping mechanism, the sliding bracket comprising:
   at least one first sliding rail (10) having a first U-shaped portion (13), a front-end portion of the first sliding rail (10) having a first locating plate (14) the first locating plate (14) having a first slot (17) with a closure portion (171);
   at least one first bracket (11) having a first L-shaped portion (15), a front-end portion of the first bracket (11) having a first locating post (16);
   at least one second sliding rail (20) having a second U-shaped portion (23), a device (30) adapted to be fixed between the first sliding rail (10) and the second sliding rail (20);
   at least one second bracket (22) having a second L-shaped portion (25), the first and second brackets (11, 22) adapted to be fixed on a first level space of a rack (40);
   wherein the first U-shaped portion (13) is configured to slide on the first L-shaped portion (15), the second U-shaped portion (23) is configured to slide on the second L-shaped portion (25); when the device (30) is pulled out, the first locating post (16) enters the first slot (17) of the first locating plate (14), and the first locating post (16) blocks the closure portion (171) of the first slot (17), therefore the first sliding rail (10) forms a first anti-dropping position to stop sliding; and the first slot (17) is adapted to escape from the first locating post (16) when an extension portion (141) of the first locating plate (14) is pressed.

2. The suspension type sliding bracket having anti-dropping mechanism of claim 1, wherein a front-end portion of the second sliding rail (20) having a second locating plate (24), a front-end portion of the second bracket (22) having a second locating post (26); when the device (30) is pulled out, the second locating post (26) enters a second slot (27) of the second locating plate (24), and the second locating post (26) blocks a closure portion (271) of the second slot (27), therefore the second sliding rail (20) stops sliding; and the second slot (27) is adapted to escape from the second locating post (26) when an extension portion (241) of the second locating plate (24) is pressed.

3. The suspension type sliding bracket having anti-dropping mechanism of claim 2, wherein the closure portion (171) of the first slot (17) and the closure portion (271) of the second slot (27) further have a distance (D) in sliding direction (X), therefore the second sliding rail (20) forms a second anti-dropping position.

4. The suspension type sliding bracket having anti-dropping mechanism of claim 1, wherein the position of the first U-shaped portion (13) is lower than a top surface (31) of the device (30), and the position of the second U-shaped portion (23) is lower than the top surface (31) of the device (30).

5. The suspension type sliding bracket having anti-dropping mechanism of claim 1, wherein the first bracket (11) has a first master bracket (51) and a first extension bracket (61), a fixing portion (53) of the first master bracket (51) and a fixing portion (63) of the first extension bracket (61) is adapted to be fixed on the rack (40); the second bracket (22) has a second master bracket (52) and a second extension bracket (62), a fixing portion (54) of the second master bracket (52) and a fixing portion (64) of the second extension bracket (62) is adapted to be fixed on the rack (40).

6. The suspension type sliding bracket having anti-dropping mechanism of claim 5, wherein each of the first and second master brackets (51, 52) has at least one bending portion (b1) and at least one bending portion (b2), each of the bending portions (b1) forms a rail space (s1), each of the bending portions (b2) forms another rail space (s2); each of the first and second extension brackets (61, 62) has at least one bending portion (b3) and at least one bending portion (b4), each of the bending portions (b3) is adapted to be inserted into each of the rail spaces (s1), each of the bending portions (b4) is adapted to be inserted into each of the rail spaces (s2).

7. The suspension type sliding bracket having anti-dropping mechanism of claim 5, wherein a first support screw (71) is adapted to be screw fixed on the fixing portion (53) of the first master bracket (51), a screw head (72) of the first support screw (71) is adapted to pass through a fixing hole (47) of the rack (40), the fixing hole (47) is adapted to support a neck (73) of the first support screw (71); and at least one fixing screw (81) is adapted to pass through another fixing hole (48) of the rack (40), the fixing portion (53) of the first master bracket (51) uses the fixing screw (81) to fix on the rack (40).

8. The suspension type sliding bracket having anti-dropping mechanism of claim 5, wherein a first support screw (71) is adapted to be screw fixed on the fixing portion (63) of the first extension bracket (61), the screw head (72) of the first support screw (71) is adapted to pass through a fixing hole (47*a*) of the rack (40), the fixing hole (47*a*) is adapted to support a neck (73) of the first support screw (71); and at least one fixing screw (81) is adapted to pass through another fixing hole (48*a*) of the rack (40), the fixing portion (63) of the first extension bracket (61) uses use the fixing screw (81) to fix on the rack (40).

* * * * *